United States Patent
Pan et al.

(10) Patent No.: US 12,557,327 B2
(45) Date of Patent: Feb. 17, 2026

(54) SEMICONDUCTOR DEVICE AND METHOD FOR FABRICATING THE SAME

(71) Applicant: UNITED MICROELECTRONICS CORP., Hsinchu (TW)

(72) Inventors: Chen-Wei Pan, Hsinchu County (TW); Sheng Cho, New Taipei (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 648 days.

(21) Appl. No.: 17/903,072

(22) Filed: Sep. 6, 2022

(65) Prior Publication Data

US 2024/0014323 A1 Jan. 11, 2024

(30) Foreign Application Priority Data

Jul. 6, 2022 (CN) .......................... 202210796978.8

(51) Int. Cl.
| | |
|---|---|
| *H10D 30/62* | (2025.01) |
| *H10D 30/01* | (2025.01) |
| *H10D 62/13* | (2025.01) |
| *H10D 84/01* | (2025.01) |
| *H10D 84/03* | (2025.01) |
| *H10D 88/00* | (2025.01) |

(52) U.S. Cl.
CPC ....... *H10D 30/6211* (2025.01); *H10D 30/024* (2025.01); *H10D 62/151* (2025.01); *H10D 84/013* (2025.01); *H10D 84/0158* (2025.01); *H10D 84/038* (2025.01); *H10D 88/00* (2025.01)

(58) Field of Classification Search
CPC ............. H10D 30/6211; H10D 30/024; H10D 62/151; H10D 84/013; H10D 84/0158; H10D 84/038; H10D 88/00; H10D 10/061; H10D 10/60; H10D 62/117; H10D 62/126; H10D 62/134; H10D 62/137; H10D 62/184; H10D 84/834; H10D 84/0109; H10D 84/401; H10D 10/00; H10D 10/01
See application file for complete search history.

(56) References Cited

U.S. PATENT DOCUMENTS

| | | | |
|---|---|---|---|
| 9,368,594 B2 | 6/2016 | Chang et al. | |
| 2015/0076554 A1* | 3/2015 | Laven | H10D 12/461 438/138 |
| 2017/0077273 A1* | 3/2017 | Kitagawa | H10D 64/256 |
| 2020/0105874 A1* | 4/2020 | Yilmaz | H01L 21/2855 |
| 2020/0403007 A1* | 12/2020 | Thomson | H10D 8/422 |
| 2021/0036135 A1* | 2/2021 | Liu | H10D 12/481 |

* cited by examiner

*Primary Examiner* — Yasser A Abdelaziez
(74) *Attorney, Agent, or Firm* — WPAT, PC (57) ABSTRACT

A semiconductor device includes a substrate; a fin structure disposed over the substrate; a gate structure disposed over the substrate, wherein an extension direction of the fin structure intersects an extension direction of the gate structure; and a first well disposed under the gate structure, corresponding to an emitter region of the semiconductor device, and having a first conductivity type, wherein the first well is adjacent to a well block layer, and the well block layer is disposed under the gate structure in the emitter region; wherein the well block layer has a first doping concentration of a well implant, the first well has a second doping concentration of the well implant, and the first doping concentration is less than the second doping concentration.

20 Claims, 8 Drawing Sheets

SEMICONDUCTOR DEVICE AND METHOD FOR FABRICATING THE SAME

This application claims the benefit of People's Republic of China application Serial No. 202210796978.8, filed Jul. 6, 2022, the subject matter of which is incorporated herein by reference.

BACKGROUND OF THE INVENTION

Field of the Invention

The invention relates to a semiconductor device, and more particularly to a three-dimensional semiconductor device.

Description of the Related Art

In recent years, semiconductor devices have been in great demands. With the development of three-dimensional semiconductor devices, fin field-effect transistors (FinFETs) have become the mainstream due to their higher device density and higher performance. FinFETs can be applied to bipolar transistors (BJTs). At present, there is still an urgent need to study an improved FinFET BJT.

SUMMARY OF THE INVENTION

The present invention relates to a semiconductor device. Since a well block layer is disposed under a gate structure in an emitter region, the current gain can be significantly increased.

According to an embodiment of the present invention, a semiconductor device is provided. The semiconductor device includes a substrate, a fin structure, a gate structure and a first well. The fin structure is disposed over the substrate. The gate structure is disposed over the substrate. An extension direction of the fin structure intersects an extension direction of the gate structure. The first well is disposed under the gate structure and corresponds to an emitter region of the semiconductor device, and the first well has a first conductivity type, wherein the first well is adjacent to a well block layer, and the well block layer is disposed under the gate structure in the emitter region. The well block layer has a first doping concentration of a well implant, the first well has a second doping concentration of the well implant, and the first doping concentration is less than the second doping concentration.

According to another embodiment of the present invention, a method for fabricating a semiconductor device is provided. A method for fabricating the semiconductor device includes the following steps. First, a substrate is provided. Next, a fin structure is formed. The fin structure is disposed over the substrate. A gate structure is formed. The gate structure is disposed over the substrate, and an extension direction of the fin structure intersects an extension direction of the gate structure. A first well is formed. The first well is disposed under the gate structure and corresponds to an emitter region of the semiconductor device. A well block layer is formed. The well block layer is disposed under the gate structure in the emitter region. The well block layer has a first doping concentration of a well implant, the first well has a second doping concentration of the well implant, and the first doping concentration is less than the second doping concentration.

The above and other aspects of the invention will become better understood with regard to the following detailed description of the preferred but non-limiting embodiment(s). The following description is made with reference to the accompanying drawings.

DETAILED DESCRIPTION OF THE INVENTION

Figure 1A:
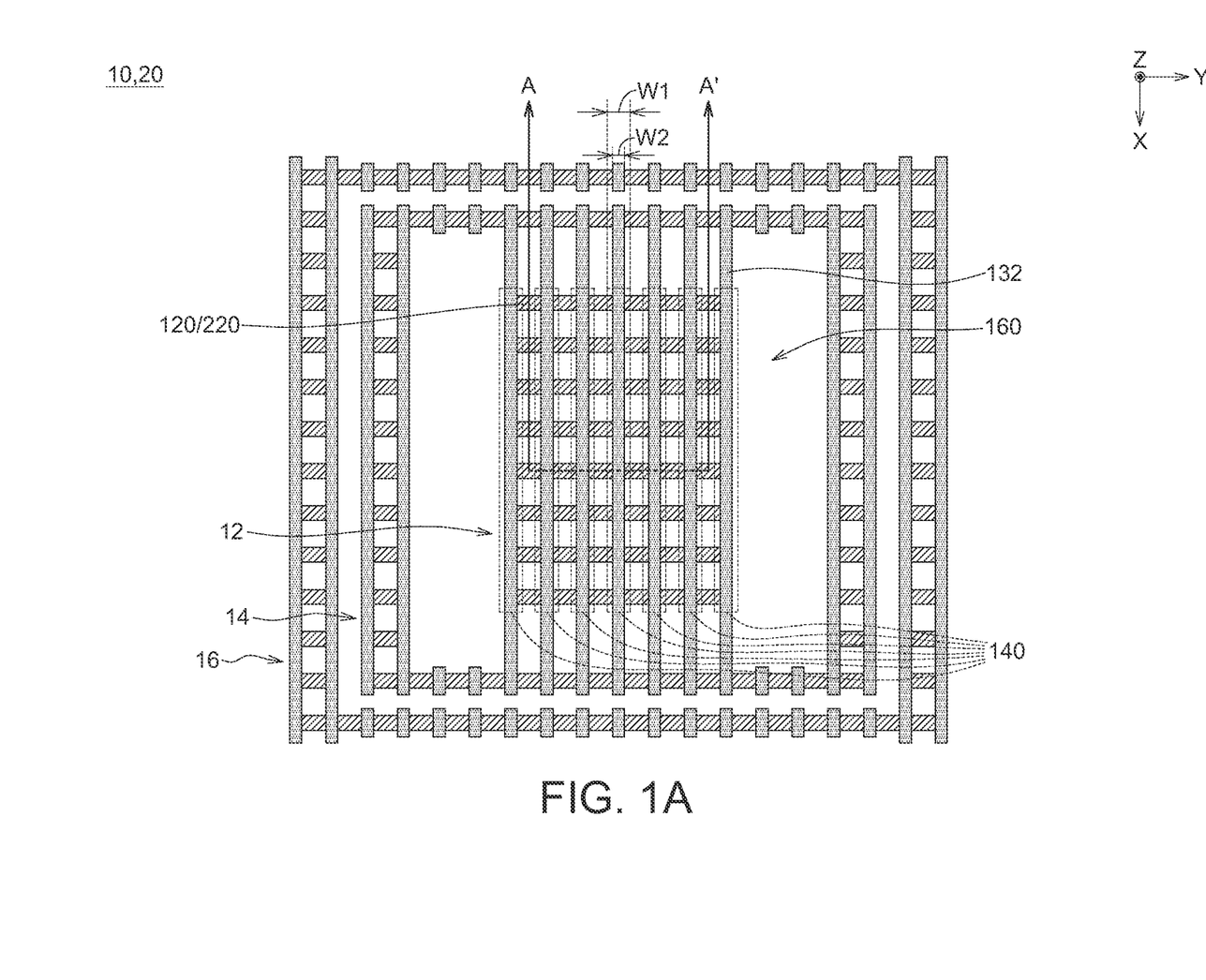
FIG. 1A is a top view of a semiconductor device according to an embodiment of the present invention.
Figure 1B:
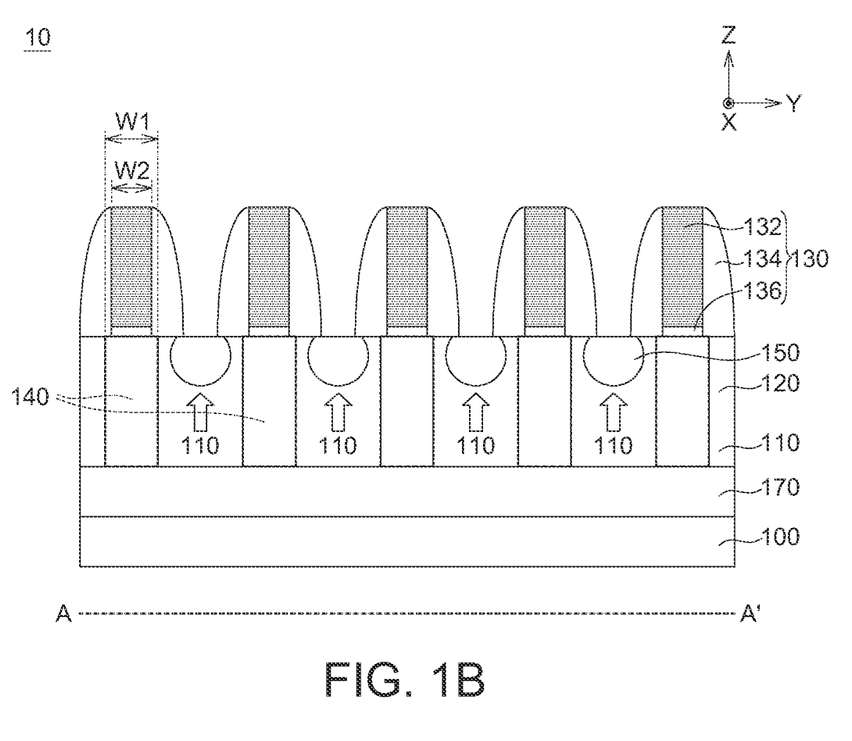
FIG. 1B is a cross-sectional view of a semiconductor device taken along the line A-A' in FIG. 1A according to an embodiment of the present invention.
Figure 1C:
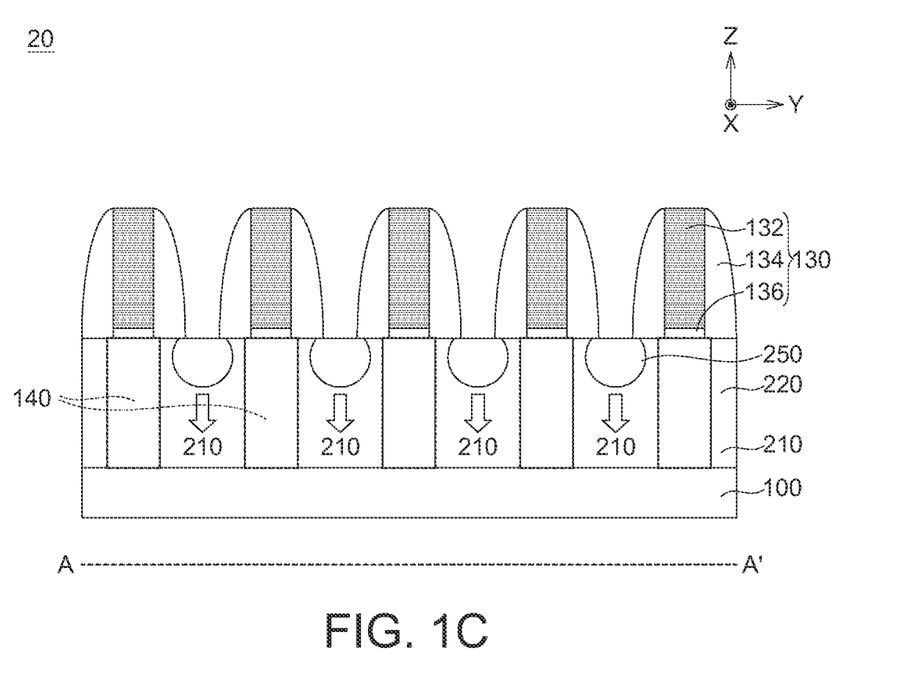
FIG. 1C is a cross-sectional view of a semiconductor device taken along the line A-A' of FIG. 1A according to an embodiment of the present invention.

FIG. 1A illustrates a top view of a semiconductor device 10 or 20 according to an embodiment of the present invention, for example, corresponding to a plane formed by a first direction (e.g., X direction) and a second direction (e.g., Y direction). FIG. 1B is a cross-sectional view of the semiconductor device 10 taken along the line A-A' of FIG. 1A according to an embodiment of the present invention. FIG. 10 is a cross-sectional view of the semiconductor device 20 taken along the line A-A' of FIG. 1A according to an embodiment of the present invention. FIGS. 1B and 10 correspond to, for example, a plane formed by the second direction (e.g., Y direction) and the third direction (e.g., Z direction). The first direction (e.g., X direction), the second direction (e.g., Y direction), and the third direction (e.g., Z direction) may be perpendicular to each other, but the present invention is not limited thereto. It can be understood that the semiconductor devices 10 and 20 may have the same or similar structures in a top view (i.e., FIG. 1A), and may have different structures in a cross-sectional view taken along the line A-A' of FIG. 1A (i.e., FIGS. 1B and 10).

Referring to FIGS. 1A and FIG. 1B at the same time, the semiconductor device 10 includes a substrate 100, a plurality of fin structures 120, a plurality of gate structures 130, a first well 110, a plurality of source/drain structures 150 and a second well 170. The semiconductor device 10 according to FIGS. 1A and 1B may be an embodiment of an NPN type FinFET BJT. The substrate 100 is, for example, a p-type substrate.

As shown in FIG. 1A, the semiconductor device 10 includes an emitter region 12, a base region 14 and a collector region 16, wherein the base region 14 surrounds the emitter region 12, and the collector region 16 surrounds the base region 14 and the emitter region 12. The base region 14 and the collector region 16 may respectively be an annular structure. In the emitter region 12, the plurality of fin structures 120 respectively extend along the second direction (e.g., Y direction) and are separated from each other in the first direction (e.g., X direction). The plurality of gate structures 130 respectively extend along the first direction (e.g., X direction) and are separated from each other in the second direction (e.g., Y direction). FIG. 1A only exemplarily illustrates the distribution of the conductive layers 132 in the gate structure 130. The extension direction (e.g., Y direction) of the fin structure 120 may intersect the extension direction (e.g., X direction) of the gate structure 130 or the conductive layer 132. In the present embodiment, the extension direction of the fin structure 120 may be perpendicular to the extension direction of the gate structure 130, but the present invention is not limited thereto. The plurality of well block layers 140 correspond to the emitter regions 12, respectively extend along a first direction (e.g., X direction), and are separated from each other in a second direction (e.g., Y direction). Similarly, the extension direction (e.g., Y direction) of the fin structure 120 may be perpendicular to the extension direction (e.g., X direction) of the well block layer 140. Also, in the third direction (e.g., Z direction), the gate structure 130 (and the conductive layer 132) may overlap the well block layer 140. In addition, isolation regions 160 are formed in regions between the fin structures 120 and regions on two sides of the fin structures 120. The isolation regions 160 may include silicon oxide, silicon nitride, silicon oxynitride, silicon carbide, high-density plasma oxide (HDP oxide), tetraethoxysilane oxide (TEOS oxide), other suitable dielectric materials or an arbitrary combination thereof. The isolation region 160 is, for example, a shallow trench isolation region (STI region).

As shown in FIG. 1B, the fin structure 120 is disposed over the substrate 100. The gate structure 130 is also disposed over the substrate 100. More specifically, the gate structure 130 is disposed over the fin structure 120. The first well 110 is disposed under the gate structure 130 and corresponds to an emitter region 12 of the semiconductor device 10, and the first well 110 has a first conductivity type (e.g., p-type). The second well 170 is disposed under the first well 110, and the second well 170 has a second conductivity type (e.g., n-type) different from the first conductivity type. The second well 170 is also known as a deep n well. The first well 110 is adjacent to the well block layers 140. The well block layers 140 are disposed under the gate structures 130 in the emitter region 12. For example, the well block layers 140 extend from the bottom of the gate structures 130 to the top of the second well 170 along a third direction (e.g., Z direction). In some embodiments, a height of the well block layer 140 in the third direction (e.g., Z direction) may be equal to a sum of heights of the fin structure 120 and the first well 110 in the third direction (e.g., Z direction). In some embodiments, the first well 110 may be formed by doping well implants into the upper portion of the substrate 100 through a doping process. Before the step of forming the first well 110 by the doping process, since a photoresist layer (not shown) is formed over the substrate 100 (corresponding to the emitter region 12) in predetermined regions of the well block layers 140, the well implants are blocked by the photoresist layer, and is less likely to be doped into the regions disposed under the photoresist layer during the doping process for forming the first well 110, and the regions disposed under the photoresist layer (i.e., the regions blocked by the photoresist layer) form the well block layer 140. The profile of the photoresist layer may be the same as the profile of the well block layers 140, that is, the extension direction of the photoresist layer intersects the extension direction of the fin structures 120. It can be seen that the well block layers 140 have a first doping concentration of the well implant, the first well 110 has a second doping concentration of the well implant, and the first doping concentration is less than the second doping concentration. The first doping concentration may approach zero. In the present embodiment, the conductivity type of the well implants of the first well 110 can be p-type, but the present invention not limited thereto.

According to some embodiments, the source/drain structures 150 are disposed over the substrate 100 and adjacent to the gate structures 130. The source/drain structures 150 are, for example, disposed in the fin structures 120 and disposed between adjacent well block layers 140. That is, the well block layers 140 separate the adjacent source/drain structures 150. By arranging the well block layers 140 under the gate structures 130 and arranging the source/drain structures 150 between the well block layers 140, the current can be limited by the well block layers 140, the current path of the semiconductor device of the present invention can be more concentrated (that is, concentrated under the source/drain structures 150, as shown by the arrows in FIG. 1B) and can have a higher current gain effect in comparison with the comparative example having no well block layer, accordingly. In the present embodiment, the source/drain structures 150 may be an n+ epitaxy, and the material of the source/drain structures 150 may include silicon phosphide (SiP), but the present invention is not limited thereto.

Each of the gate structures 130 includes an electrode layer 132, spacers 134 and a gate oxide 136. The gate oxide 136 is disposed under the electrode layer 132, and the spacers 134 are disposed on opposite sides of the electrode layer 132 and the gate oxide 136. In the present embodiment, a width W1 of the well block layer 140 in the second direction (e.g., Y direction) is greater than a width W2 of the electrode layer 132 in the second direction (e.g., Y direction). In other embodiments, the width of the well block layer 140 in the second direction (e.g., Y direction) may be equal to the width of the electrode layer 132 in the second direction (e.g., Y direction). In some embodiments, a thickness of the gate oxide 136 may be the same as a thickness of the gate oxide (not shown) disposed in a core cell. The core cell is, for example, a logic device.

Referring to FIGS. 1A and 10 simultaneously, the semiconductor device 20 includes a substrate 100, a plurality of fin structures 220, a plurality of gate structures 130, a first well 210 and a plurality of source/drain structures 250. The semiconductor device 20 according to FIGS. 1A and 10 may be an embodiment of a PNP type FinFET BJT. Elements in the semiconductor device that are the same or similar to those of the semiconductor device 10 use the same or similar reference numerals, and may have the same or similar structures, materials, functions and properties, and repeated contents will not be described in detail.

As shown in FIG. 1A, the semiconductor device 20 includes an emitter region 12, a base region 14 and a collector region 16, wherein the base region 14 surrounds the emitter region 12, and the collector region 16 surrounds the base region 14 and the emitter region 12. In the emitter region 12, the plurality of fin structures 220 respectively extend along the second direction (e.g., Y direction) and are separated from each other in the first direction (e.g., X direction). The extension direction (e.g., Y direction) of the fin structures 220 may intersect the extension direction (e.g., X direction) of the gate structures 130 or the conductive layers 132. In the present embodiment, the extension direction of the fin structures 220 may be perpendicular to the extension direction of the gate structures 130, but the present invention is not limited thereto. The extension direction (e.g., Y direction) of the fin structures 220 may be perpendicular to the extension direction (e.g., X direction) of the well block layers 140.

As shown in FIG. 1C, the fin structures 220 are disposed over the substrate 100. The gate structures 130 are also disposed over the substrate 100. More specifically, the gate structures 130 are disposed over the fin structures 220. The first well 210 is disposed under the gate structures 130 and corresponds to an emitter region 12 of the semiconductor device 20, and the first well 210 has a first conductivity type (e.g., n-type). There is no second well of different conductivity type disposed under the first well 210 of the semiconductor device 20. Similarly, the well block layers 140 are disposed under the gate structures 130 in the emitter region 12. For example, the well block layers 140 extend downward from the bottom of the gate structures 130 along the third direction (e.g., Z direction). In some embodiments, a height of the well block layer 140 in the third direction (e.g., Z direction) may be equal to the sum of the heights of the fin structure 220 and the first well 210 in the third direction (e.g., Z direction). In some embodiments, the first well 210 may be formed by doping well implants into the upper portion of the substrate 100 through a doping process. A photoresist layer (not shown) is formed over the substrate 100 in the predetermined regions of the well block layers 140 (corresponding to the emitter region 12) before the step of doping process to form the first well 210. Therefore, the well implants are blocked by the photoresist layer during the doping process to form the first well 210, and are less likely to be doped into the regions under the photoresist layer, and the regions disposed under the photoresist layer (i.e., the regions blocked by the photoresist layer) form the well block layers 140. The profile of the photoresist layers may be the same as the profile of the well block layers 140, that is, the extension direction of the photoresist layer intersects the extension direction of the fin structures 220. It can be seen that the well block layers 140 have a first doping concentration of the well implant, the first well 210 has a second doping concentration of the well implant, and the first doping concentration is less than the second doping concentration. The first doping concentration may approach zero. In the present embodiment, the conductivity type of the well implant of the first well 210 may be n-type, but the present invention is not limited thereto.

According to some embodiments, the source/drain structures 250 are disposed over the substrate 100 and are adjacent to the gate structures 130. The source/drain structures 250 are, for example, disposed in the fin structures 220 and are disposed between adjacent well block layers 140. That is, the well block layers 140 separate the adjacent source/drain structures 250. By arranging the well block layers 140 under the gate structures 130 and arranging the source/drain structures 250 between the well block layers 140, the current can be limited by the well block layers 140, the current path of the semiconductor device of the present invention can be more concentrated (that is, concentrated under the source/drain structures 250, as shown by the arrows in FIG. 1C), and the semiconductor device of the present invention can have a higher current gain effect in comparison with the comparative example having no well block layer. In the present embodiment, the source/drain structures 250 may be p+ epitaxy, and the material of the source/drain structures 250 may include silicon germanium (SiGe), but the invention is not limited thereto.

Figure 2A:
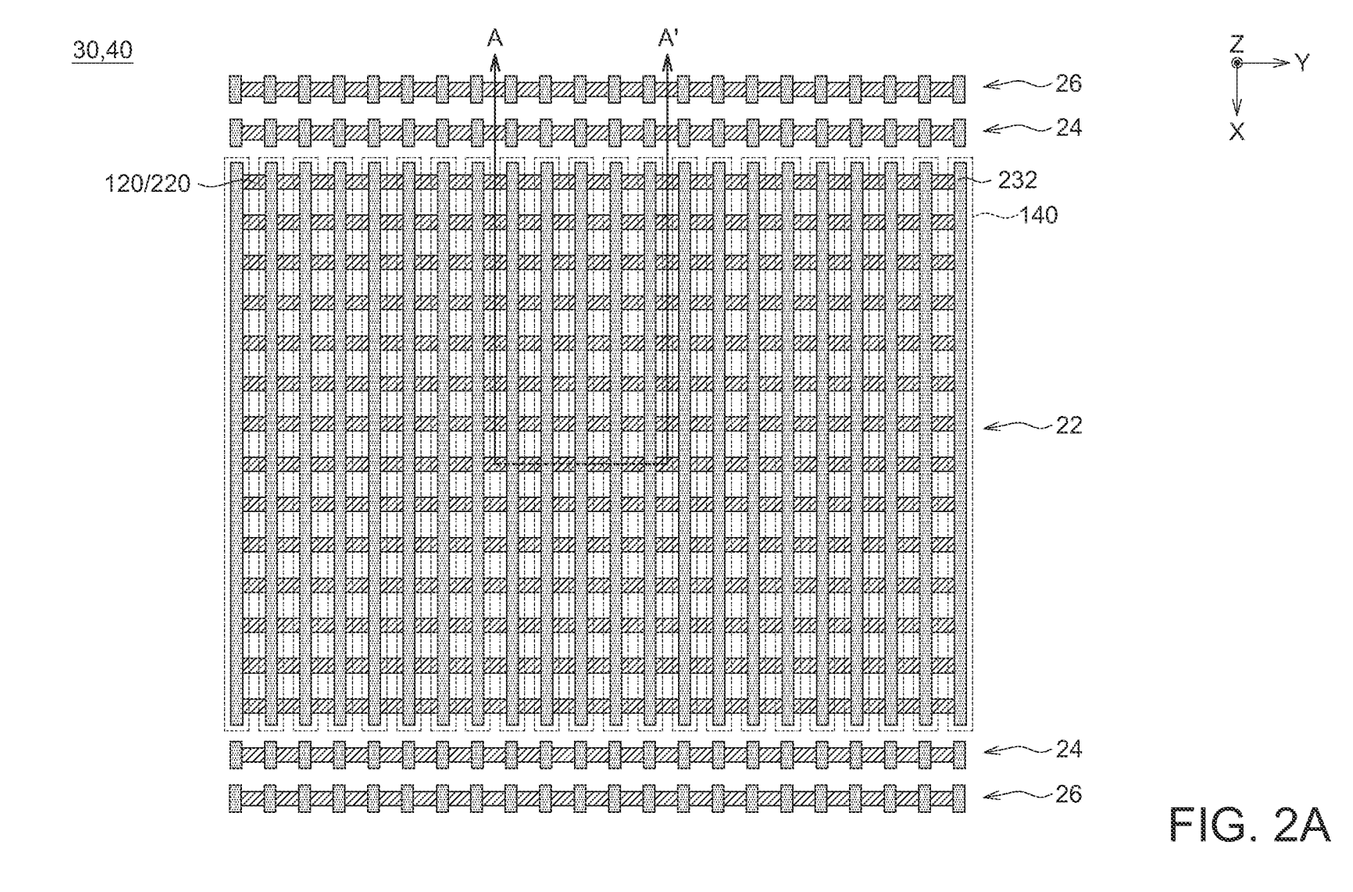
FIG. 2A is a top view of a semiconductor device according to an embodiment of the present invention.
Figure 2B:
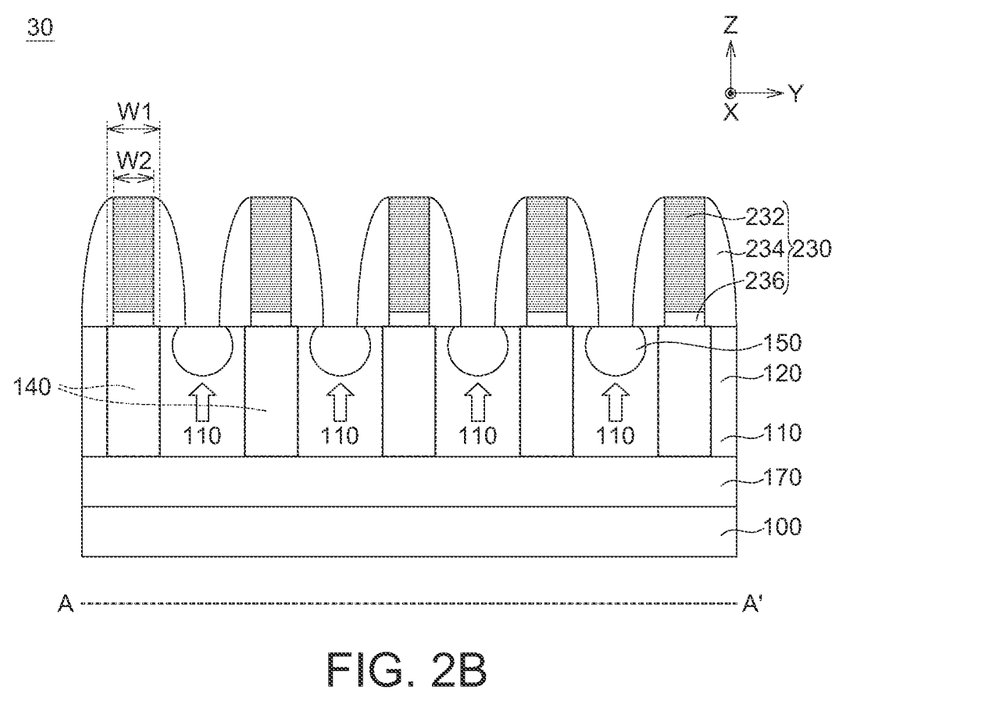
FIG. 2B is a cross-sectional view of the semiconductor device taken along the line A-A' of FIG. 2A according to an embodiment of the present invention.
Figure 2C:
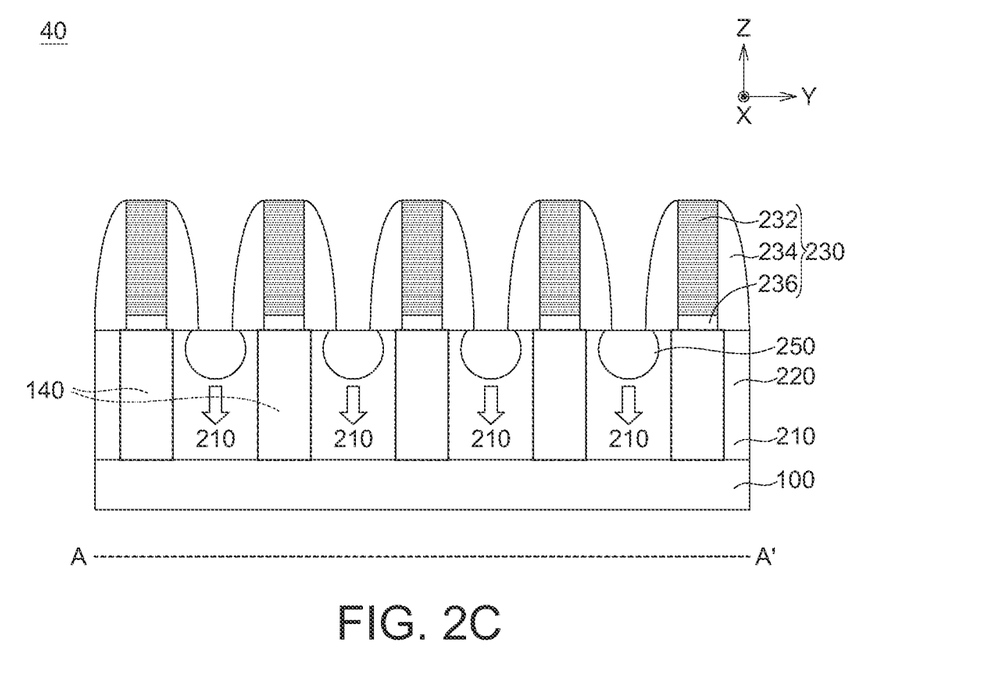
FIG. 2C is a cross-sectional view of the semiconductor device taken along the line A-A' of FIG. 2A according to an embodiment of the present invention.

FIG. 2A shows a top view of the semiconductor device 30 or 40 according to an embodiment of the present invention, for example, corresponding to a plane formed by a first direction (e.g., X direction) and a second direction (e.g., Y direction). FIG. 2B is a cross-sectional view of the semiconductor device 30 taken along the line A-A' in FIG. 2A according to an embodiment of the present invention. FIG. 2C is a cross-sectional view of the semiconductor device 40 taken along the line A-A' of FIG. 2A according to an embodiment of the present invention. FIGS. 2B and 2C correspond to, for example, a plane formed by the second direction (e.g., Y direction) and the third direction (e.g., Z direction). The first direction (e.g., X direction), the second direction (e.g., Y direction), and the third direction (e.g., Z direction) may be perpendicular to each other, and the present invention is not limited thereto. It can be understood that the semiconductor devices 30 and 40 may have the same or similar structures in a top view (i.e., FIG. 2A), and may have different structures in cross-sectional views (i.e., FIGS. 2B and 2C) taken along the line A-A' in FIG. 2A.

As shown in FIG. 2A, the configuration of the emitter region 22, the base region 24 and the collector region 26 of the semiconductor device 30 or is different from the configuration of the emitter region 12, the base region 14 and the collector region 16 of the semiconductor device 10 or 20. The extension directions of the emitter region 22, the base region 24 and the collector region 26 are parallel to each other. In the present embodiment, the emitter region 22, the base region 24 and the collector region 26 extend along the second direction (e.g., Y direction), respectively, and can be respectively a bar-shaped structure. The emitter region 22 is disposed in the middle region, and the two base regions 24 are disposed on opposite sides of the emitter region 22, that is, the two base regions 24 are not connected to each other, but are separated from each other by the emitter region 22. The two collector regions 26 are disposed on opposite sides of the emitter region 22, and are respectively disposed on the other side of the base region 24 opposite to the emitter region 22.

The cross-sectional views of the semiconductor devices 30 and 40 shown in FIGS. 2B and 2C are respectively similar to the cross-sectional views of the semiconductor devices 10 and 20 shown in FIGS. 1B and 1C, and the same or similar components are designated by the same or similar reference numerals. The repeated contents will not be described in detail.

As shown in FIG. 2B, each of the gate structures 230 of the semiconductor device 30 includes an electrode layer 232, spacers 234 and a gate oxide 236. The gate oxide 236 is disposed under the electrode layer 232, and the spacers 234 are disposed on opposite sides of the electrode layer 232 and the gate oxide 236. In some embodiments, a thickness of the gate oxide 236 of the semiconductor device 30 in the third direction (e.g., Z direction) is greater than a thickness of the gate oxide 136 of the semiconductor device 10 (as shown in FIG. 1B) in the third direction (e.g., Z direction). The thickness of the gate oxide 236 of the semiconductor device 30 in the third direction (e.g., Z direction) is the same as a thickness of a gate oxide disposed in an input/output device (not shown) in the third direction (e.g. Z direction).

As shown in FIG. 2C, the gate structure 230 of the semiconductor device 40 includes an electrode layer 232, spacers 234 and a gate oxide 236. The gate oxide 236 is disposed under the electrode layer 232, and the spacers 234 are disposed on opposite sides of the electrode layer 232 and the gate oxide 236. In some embodiments, a thickness of the gate oxide 236 of the semiconductor device 40 in the third direction (e.g., Z direction) is greater than a thickness of the gate oxide 136 of the semiconductor device 20 (as shown in FIG. 1C) in the third direction (e.g., Z direction). The thickness of the gate oxide 236 of the semiconductor device 40 in the third direction (e.g., Z direction) is the same as a thickness of a gate oxide disposed in an input/output device (not shown) in the third direction (e.g., Z direction).

Figure 3:
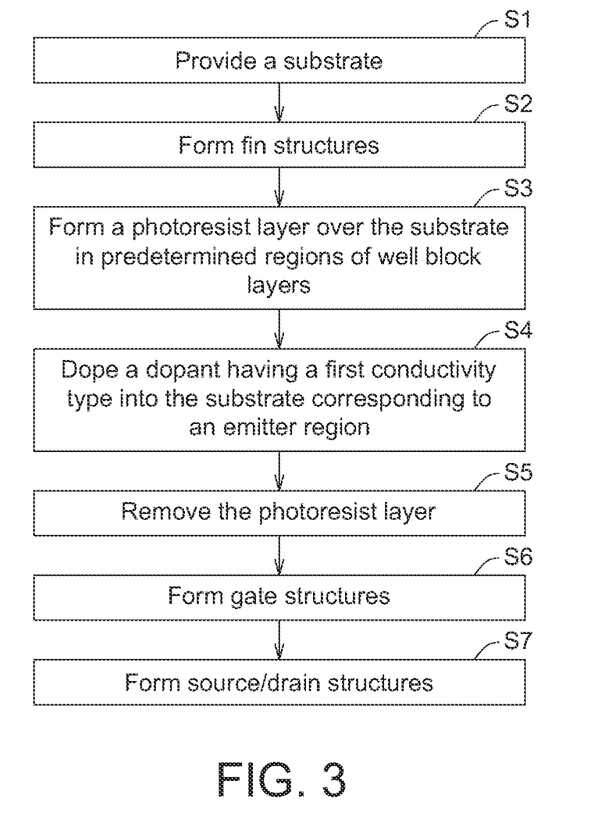
FIG. 3 is a flowchart of a method for fabricating a semiconductor device according to an embodiment of the present invention.

FIG. 3 is a flowchart illustrating a method for fabricating the semiconductor device 10 according to an embodiment of the present invention. The present embodiment briefly provides steps S1 to S7 for sequentially forming the semiconductor device 10. It should be understood that the method for fabricating the semiconductor device 10 may include other steps existing in the art.

First, as shown in step S1, a substrate 100 is provided. Next, as shown in step S2, a plurality of fin structures 120 are formed, and the fin structures 120 are disposed over the substrate 100. After the fin structures 120 are formed, as shown in step S3, a photoresist layer is formed over the substrate 100 in predetermined regions of the well block layers 140, wherein the extension direction of the photoresist layer intersect the extension direction of the fin structures 120 and the profile of the photoresist layer are the same as the profile of the well block layers 140. As shown in step S4, dopants having a first conductivity type are doped into the substrate 100 corresponding to the emitter region 12 to form a first well 210 disposed over the substrate 100, and the regions in the emitter region 12 blocked by the photoresist layer become the well block layers 140. As shown in step S5, the photoresist layer is removed. As shown in step S6, the gate structures 130 are formed, and the gate structures 130 are disposed over the substrate 100, wherein the extension direction of the fin structures 120 intersects the extension direction of the gate structures 130. As shown in step S7, source/drain structures 150 are formed. The source/drain structures 150 are disposed over the substrate 100 and are adjacent to the gate structures 130.

The semiconductor devices 20 to 40 can be formed through the similar steps to the above-mentioned steps of the semiconductor device 10, and those ordinarily skilled in the art can make adjustments according to requirements.

According to some embodiments of the present invention, semiconductor devices 10 to 40 are provided. The semiconductor devices 10 to 40 are, for example, FinFET BJTs. Compared with the comparative example without the well block layer, since the semiconductor devices 10 to 40 have the well block layers 140 disposed under the gate structures 130 or 230 in the emitter region 12 or 22, and the doping concentration of the well implant (for example, approaching 0, and no well implant) in the well block layers 140 is less than the doping concentration of the well implant in the adjacent first well 110, the current paths flowing into or out of the source/drain structures 150 or 250 can be limited by the well block layers 140 and more concentrated in the first well 110 under the source/drain structures 150 or 250, the recombination current can be reduced accordingly, and the common-emitter current gain β can be significantly increased, as shown in FIG. 4A and FIG. 4B (details will be described below).

Figure 4A:
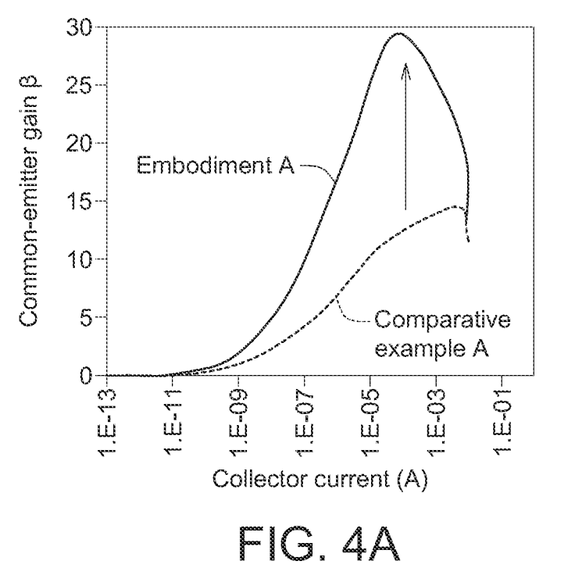
FIG. 4A is a graph showing the relationship between the common-emitter gain $\beta$ and the collector current ($I_C$) of Embodiment A and Comparative Example A.

FIG. 4A is a graph showing the relationship between the common-emitter current gain β and the collector current ($I_C$) of Embodiment A and Comparative Example A. FIG. 4B is a graph showing the relationship between the common-emitter current gain β and the collector current ($I_C$) of Embodiment B and Comparative Example B. The X-axis represents the collector current ($I_C$) in amperes (A). The Y-axis represents the common-emitter current gain β.

Embodiment A is, for example, the semiconductor device 10 of the present application (as shown in FIG. 1A and FIG. 1B). The semiconductor device of Comparative Example A has a structure similar to that of the semiconductor device 10 of Embodiment A, and the difference is in that the semiconductor device of Comparative Example A does not have a well block layer disposed in the emitter region. Embodiment B is, for example, the semiconductor device 30 of the present application (as shown in FIGS. 2A and 2B). The semiconductor device of Comparative Example B has a structure similar to that of the semiconductor device 30 of Embodiment B, and the difference is in that the semiconductor device of Comparative Example B does not has a well block layer disposed in the emitter region.

Figure 4B:
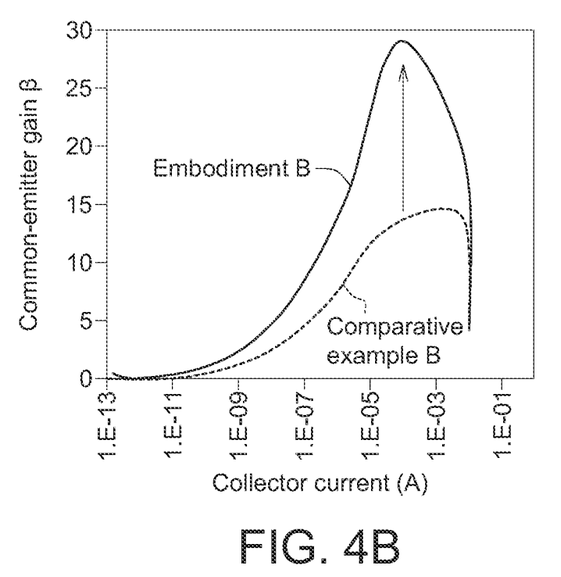
FIG. 4B is a graph showing the relationship between the common-emitter gain $\beta$ and the collector current ($I_C$) of Embodiment B and Comparative Example B.

It can be seen from the results in FIGS. 4A and 4B that, compared with Comparative Examples A and B, the common-emitter current gain β of Embodiments A and B are significantly increased. For example, when the collector current is $1\times10^{-4}$ amperes, compared with Comparative Example A, the common-emitter current gain β of Embodiment A is increased by 100%; compared with Comparative Example B, the common-emitter current gain β of Embodiment B is increased by 100%.

In conclusion, although the present invention is disclosed in conjunction with the above embodiments, it is not intended to limit the present invention. Those skilled in the art can make various changes and modifications without departing from the spirit and scope of the present invention. Accordingly, the scope of protection of the present invention should be defined by the appended claims.

What is claimed is:

1. A semiconductor device, comprising:
   a substrate;
   a fin structure disposed over the substrate;
   a gate structure disposed over the substrate, wherein an extension direction of the fin structure intersects an extension direction of the gate structure; and
   a first well disposed under the gate structure, corresponding to an emitter region of the semiconductor device, and having a first conductivity type, wherein the first well is adjacent to a well block layer, and the well block layer is disposed under the gate structure in the emitter region;
   wherein the well block layer has a first doping concentration of a well implant, the first well has a second doping concentration of the well implant, and the first doping concentration is less than the second doping concentration.

2. The semiconductor device according to claim 1, wherein the extension direction of the fin structure is perpendicular to the extension direction of the gate structure.

3. The semiconductor device according to claim 1, wherein the extension direction of the fin structure is perpendicular to the extension direction of the well block layer.

4. The semiconductor device according to claim 1, wherein the first conductivity type is p-type.

5. The semiconductor device according to claim 1, wherein the first conductivity type is an n-type.

6. The semiconductor device according to claim 1, further comprising a second well having a second conductivity type different from the first conductivity type, wherein the second well is disposed under the first well.

7. The semiconductor device according to claim 6, wherein the first conductivity type is p-type and the second conductivity type is n-type.

8. The semiconductor device according to claim 1, further comprising a base region and a collector region, wherein the base region surrounds the emitter region, and the collector region surrounds the base region.

9. The semiconductor device according to claim 8, wherein the gate structure further comprises a first gate oxide, the first gate oxide is disposed over the well block layer, and a thickness of the first gate oxide is the same as a thickness of a second gate oxide disposed in a core cell.

10. The semiconductor device according to claim 1, further comprising a base region and a collector region, wherein extension directions of the emitter region, the base region and the collector region are parallel to each other.

11. The semiconductor device according to claim 10, wherein the gate structure further comprises a first gate oxide, the first gate oxide is disposed over the well block layer, and a thickness of the first gate oxide is the same as a thickness of a second gate oxide disposed in an input/output device.

12. The semiconductor device according to claim 1, further comprising a source/drain structure disposed over the substrate and adjacent to the gate structure.

13. The semiconductor device according to claim 12, wherein a material of the source/drain structure comprises silicon phosphide.

14. The semiconductor device according to claim 12, wherein a material of the source/drain structure comprises silicon germanium.

15. The semiconductor device according to claim 1, wherein the gate structure comprises an electrode layer, and a width of the well block layer is greater than a width of the electrode layer.

16. A method of fabricating a semiconductor device, comprising:
provided the substrate;
forming a fin structure disposed over the substrate;
forming a gate structure disposed over the substrate, wherein an extension direction of the fin structure intersects an extension direction of the gate structure; and
forming a first well disposed under the gate structure corresponding to an emitter region of the semiconductor device; and
forming a well block layer disposed under the gate structure in the emitter region;
wherein the well block layer has a first doping concentration of a well implant, the first well has a second doping concentration of the well implant, and the first doping concentration is less than the second doping concentration.

17. The method according to claim 16, further comprising:
after forming the fin structure, a photoresist layer is formed over the substrate in a predetermined region of the well block layer, wherein an extension direction of the photoresist layer intersects the extension direction of the fin structure; and
doping a dopant having a first conductivity type into the substrate corresponding to the emitter region to form the first well disposed over the substrate, and a region blocked by the photoresist layer in the emitter region becoming the well block layer.

18. The method according to claim 17, further comprising doping a dopant having a second conductivity type different from the first conductivity type into the substrate corresponding to the emitter region to form a second well, wherein the second well is disposed under the first well.

19. The method according to claim 17, further comprising forming a source/drain structure after forming the gate structure, the source/drain structure being disposed over the substrate and adjacent to the gate structure, wherein the gate structure is formed after forming the well block layer.

20. The method according to claim 19, wherein the source/drain structure comprises a material, and the material is silicon phosphide or silicon germanium.

* * * * *